United States Patent
Pi et al.

(10) Patent No.: US 12,245,518 B2
(45) Date of Patent: Mar. 4, 2025

(54) MAGNETIC MEMORY DEVICE

(71) Applicant: Samsung Electronics Co., Ltd., Suwon-si (KR)

(72) Inventors: Ung Hwan Pi, Hwaseong-si (KR); Seonggeon Park, Seongnam-si (KR); Jeong-Heon Park, Hwaseong-si (KR); Sung Chul Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 664 days.

(21) Appl. No.: 17/490,353

(22) Filed: Sep. 30, 2021

(65) Prior Publication Data
US 2022/0123201 A1 Apr. 21, 2022

(30) Foreign Application Priority Data
Oct. 20, 2020 (KR) .................. 10-2020-0135815

(51) Int. Cl.
| | | |
|---|---|---|
| H10N 50/80 | (2023.01) | |
| H01F 10/32 | (2006.01) | |
| H10B 61/00 | (2023.01) | |
| H10N 50/85 | (2023.01) | |

(52) U.S. Cl.
CPC ......... *H10N 50/80* (2023.02); *H01F 10/3254* (2013.01); *H01F 10/3272* (2013.01); *H01F 10/3286* (2013.01); *H10B 61/00* (2023.02); *H10N 50/85* (2023.02)

(58) Field of Classification Search
None
See application file for complete search history.

(56) References Cited

U.S. PATENT DOCUMENTS

| | | |
|---|---|---|
| 8,379,429 B2 | 2/2013 | Ishiwata et al. |
| 8,687,414 B2 | 4/2014 | Nagahara et al. |
| 10,020,039 B2 | 7/2018 | Fukami et al. |
| 10,127,958 B2 | 11/2018 | Kondo et al. |
| 10,170,689 B2 | 1/2019 | Tanigawa et al. |
| 10,608,169 B2 | 3/2020 | Kim et al. |
| 2006/0108620 A1* | 5/2006 | Rizzo ............... H10N 50/10 257/E27.005 |
| 2010/0193889 A1* | 8/2010 | Nagahara ............ B82Y 10/00 257/E29.323 |
| 2014/0346518 A1 | 11/2014 | Kariyada et al. |
| 2016/0247550 A1* | 8/2016 | Fukami ............. G11C 11/1675 |
| 2018/0108390 A1* | 4/2018 | Fukami ............. G11C 11/1675 |
| 2020/0083427 A1 | 3/2020 | Manipatruni et al. |

FOREIGN PATENT DOCUMENTS

| | | |
|---|---|---|
| JP | 2010-093280 A | 4/2010 |
| JP | 5370773 B2 | 12/2013 |
| KR | 101825318 B1 | 2/2018 |

* cited by examiner

*Primary Examiner* — Bo B Jang
(74) *Attorney, Agent, or Firm* — Harness, Dickey & Pierce, P.L.C.

(57) ABSTRACT

A magnetic memory device includes a first magnetic layer extending in a first direction, a pinned layer on the first magnetic layer, and a second magnetic layer vertically overlapping with the pinned layer with the first magnetic layer interposed between the pinned layer and the second magnetic layer. The first magnetic layer includes, a plurality of magnetic domains arranged in the first direction, and at least one magnetic domain wall between the plurality of magnetic domains, and a magnetization direction of the second magnetic layer is substantially parallel to a top surface of the first magnetic layer.

20 Claims, 15 Drawing Sheets

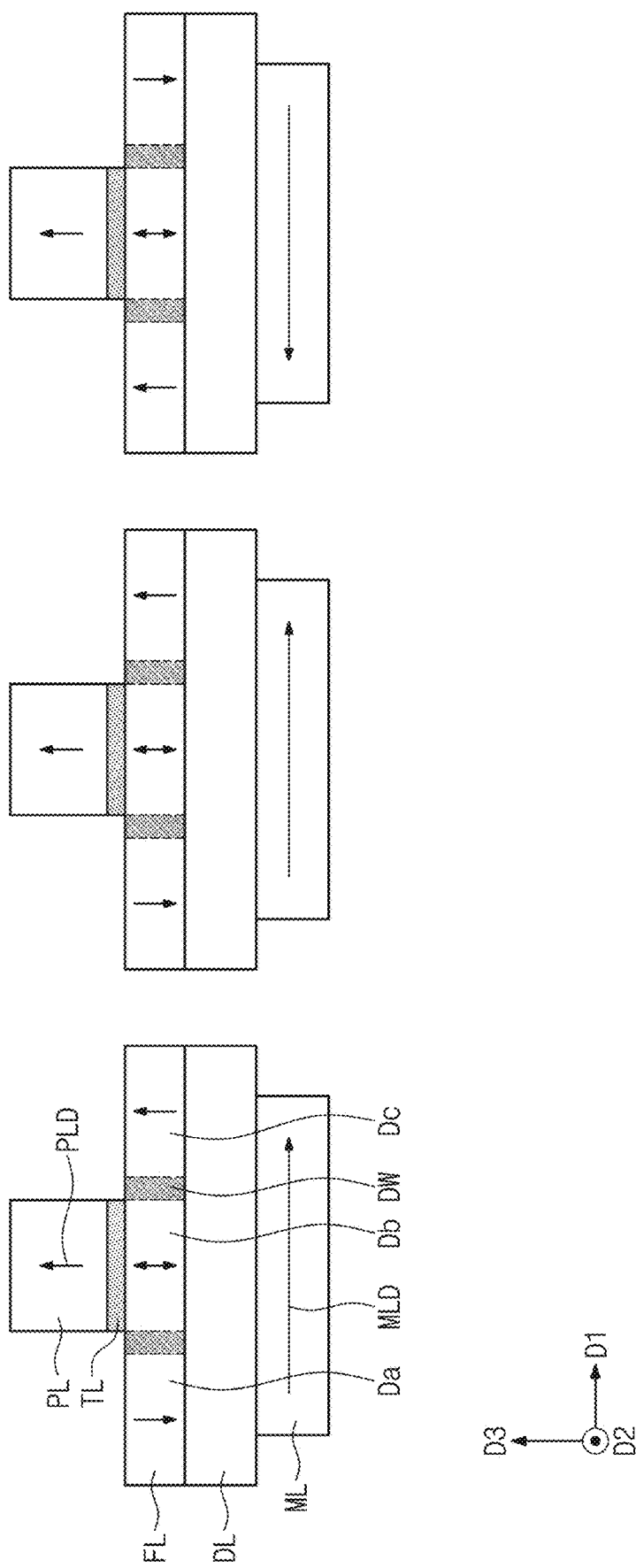

FIG. 9
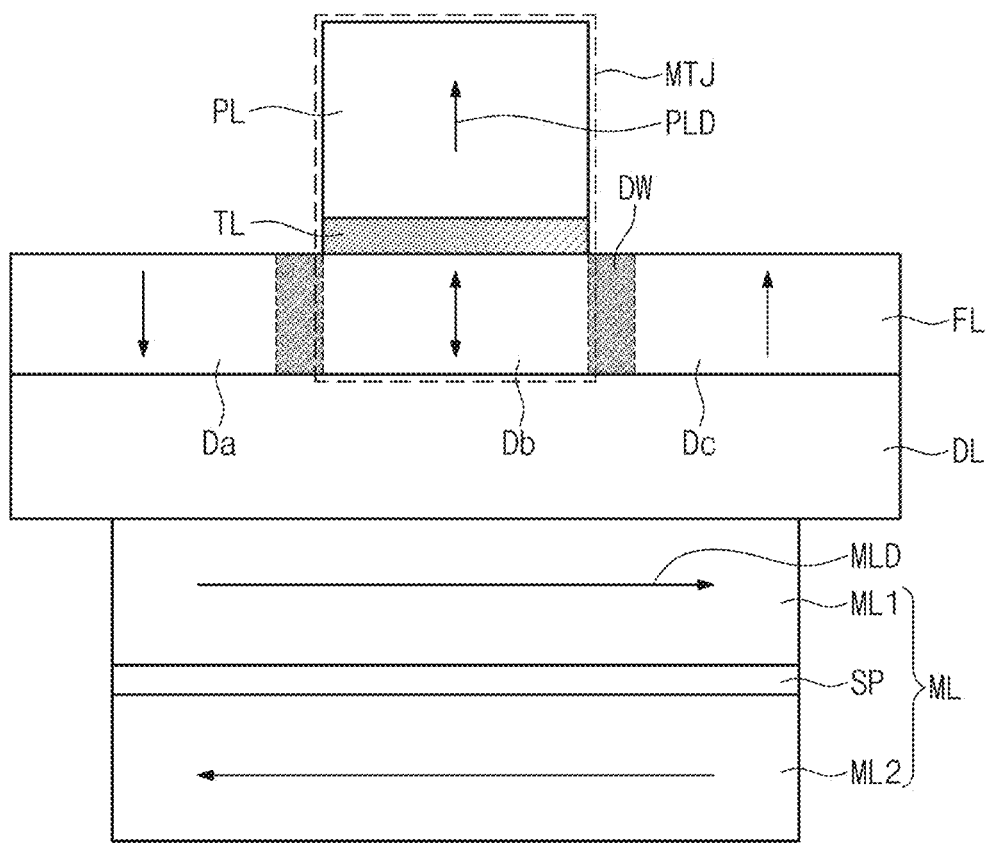
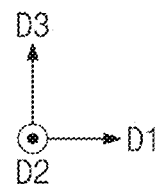

MAGNETIC MEMORY DEVICE

CROSS-REFERENCE TO RELATED APPLICATION

This U.S. non-provisional patent application claims priority under 35 U.S.C. § 119 to Korean Patent Application No. 10-2020-0135815, filed on Oct. 20, 2020, in the Korean Intellectual Property Office, the disclosure of which is hereby incorporated by reference in its entirety.

BACKGROUND

Some example embodiments of inventive concepts relate to a magnetic memory device and, more particularly, to a magnetic memory device using a movement phenomenon of a magnetic domain wall.

High-speed and/or low-voltage memory devices have been desired to realize high-speed and/or low-power electronic devices, such as memory devices. A magnetic memory device has been studied as a memory device that may satisfy these desirables. The magnetic memory device has been spotlighted as a next-generation memory device because of its high-speed operation characteristic and/or non-volatile characteristic. In particular, a new magnetic memory device using a movement phenomenon of a magnetic domain wall of a magnetic material has been studied and developed.

SUMMARY

Some example embodiments of inventive concepts may provide a magnetic memory device capable of improving reliability.

Alternatively or additionally, some example embodiments of inventive concepts may also provide a magnetic memory device capable of improving an operation speed.

According to some example embodiments, a magnetic memory device may include a first magnetic layer extending in a first direction, a pinned layer on the first magnetic layer, and a second magnetic layer vertically overlapping with the pinned layer with the first magnetic layer interposed between the pinned layer and the second magnetic layer. The first magnetic layer includes, a plurality of magnetic domains arranged in the first direction, and at least one magnetic domain wall between the plurality of magnetic domains, and a magnetization direction of the second magnetic layer is substantially parallel to a top surface of the first magnetic layer.

According to some example embodiments, a magnetic memory device may include a first magnetic layer extending in a first direction, a pinned layer provided on the first magnetic layer, and a second magnetic layer vertically overlapping with the pinned layer with the first magnetic layer interposed between the pinned layer and the second magnetic layer. The first magnetic layer includes a plurality of magnetic domains arranged in the first direction and at least one magnetic domain wall between the plurality of magnetic domains, and a magnetization direction of the second magnetic layer is substantially perpendicular to magnetization directions of the magnetic domains.

According to some example embodiments, a magnetic memory device may include a first magnetic layer extending in a first direction, a pinned layer on the first magnetic layer, a tunnel barrier pattern between the first magnetic layer and the pinned layer, a second magnetic layer vertically overlapping with the pinned layer with the first magnetic layer interposed between the pinned layer and the second magnetic layer, and an insulating layer disposed between the first magnetic layer and the second magnetic layer. The first magnetic layer includes a first magnetic domain, a second magnetic domain, and a third magnetic domain, the first through third magnetic domains sequentially arranged in the first direction, a magnetization direction of the second magnetic layer is substantially parallel to a top surface of the first magnetic layer, and a magnetization direction of the first magnetic domain and a magnetization direction of the third magnetic domain are anti-parallel to each other.

BRIEF DESCRIPTION OF THE DRAWINGS

Inventive concepts will become more apparent in view of the attached drawings and accompanying detailed description.

FIGS. 3 to 6 are cross-sectional views illustrating a method of initializing a magnetic memory device according to some example embodiments of inventive concepts.

FIG. 9 is a cross-sectional view illustrating a magnetic memory device according to some example embodiments of inventive concepts.

DETAILED DESCRIPTION OF SOME EXAMPLE EMBODIMENTS

Hereinafter, some example embodiments of inventive concepts will be described in more detail with reference to the accompanying drawings.

Figure 1:
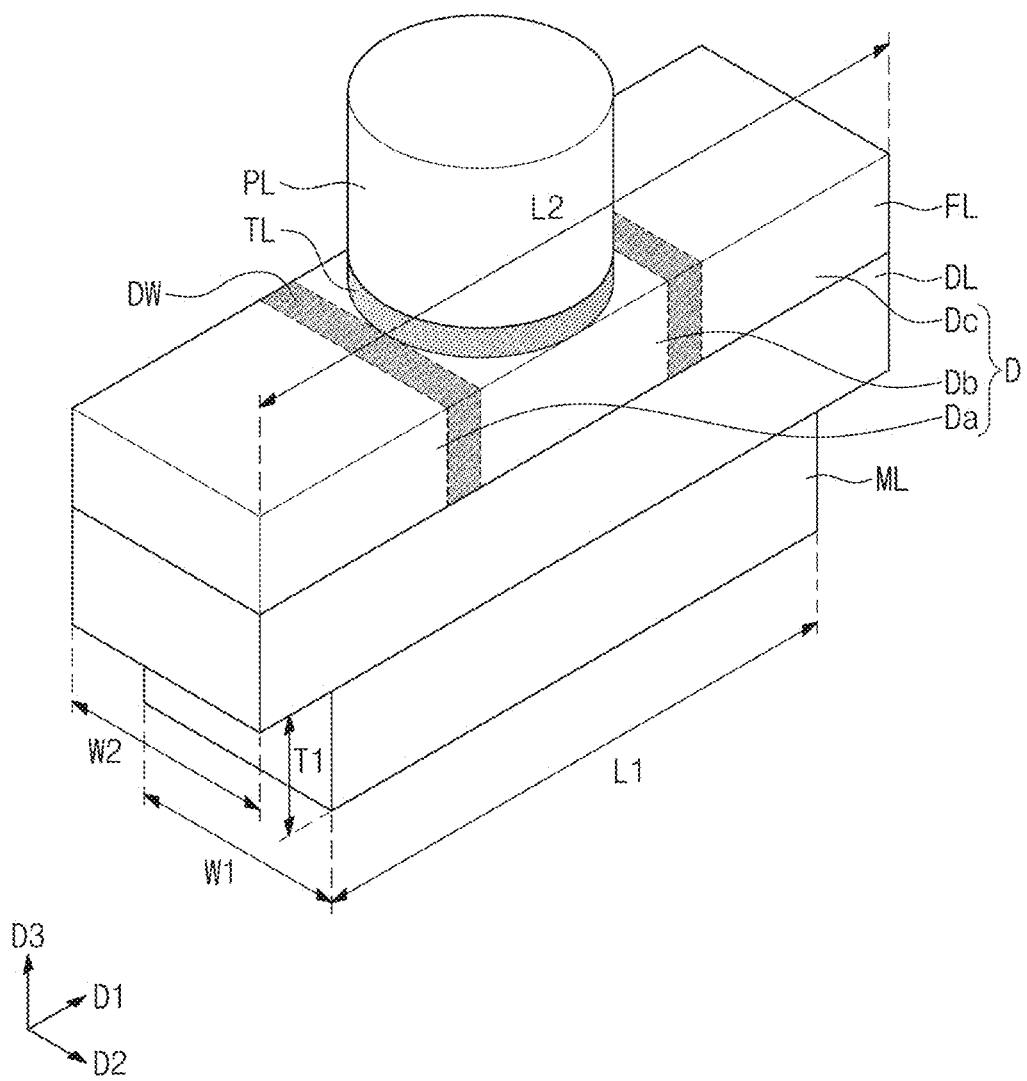
FIG. 1 is a perspective view schematically illustrating a magnetic memory device according to some example embodiments of inventive concepts.

FIG. 1 is a perspective view schematically illustrating a magnetic memory device according to some example embodiments of inventive concepts. A unit cell of a magnetic memory device will be mainly described for the purpose of ease and convenience in explanation.

Referring to FIG. 1, the unit cell of the magnetic memory device may include a pinned layer PL, a free layer or a first magnetic layer FL, a tunnel barrier pattern TL, an insulating layer DL, and a second magnetic layer ML.

The first magnetic layer FL may have a long axis extending in a first direction D1 that is parallel to a top surface of the first magnetic layer FL. For example, the first magnetic layer FL may have a track shape/rectangular prism shape extending in the first direction D1. The first magnetic layer FL may include at least one metal material of cobalt (Co), iron (Fe), or nickel (Ni). Alternatively or additionally, the first magnetic layer FL may include or further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N).

The first magnetic layer FL may include a plurality of magnetic domains D and a plurality of magnetic domain walls DW that may be between ones of the plurality of magnetic domains D. The plurality of magnetic domains D and the plurality of magnetic domain walls DW may be alternately and repeatedly arranged in the first direction D1. Each of the plurality of magnetic domains D may be or correspond to a region of a magnetic body (e.g., the first magnetic layer FL), in which a magnetization direction is uniform. Each of the plurality of magnetic domain walls DW may be or correspond to a region of the magnetic body, in which a magnetization direction changes between the magnetic domains D, e.g. a boundary between ones of the magnetic domains D. Each of the magnetic domain walls DW may define a boundary between the magnetic domains D having different magnetization directions. Sizes and/or magnetization directions of the magnetic domains D may be appropriately controlled by a shape and/or a size of the magnetic body, and/or by external energy. The magnetic domain walls DW may move, e.g. may move in at least one of the first direction D1, the second direction D2, or the third direction D3, by a magnetic field and/or by current applied to the magnetic body.

According to some example embodiments of inventive concepts, the plurality of magnetic domains D may include a first magnetic domain Da, a second magnetic domain Db and a third magnetic domain Dc, which are sequentially arranged in the first direction D1. For example, the second magnetic domain Db may be disposed between the first magnetic domain Da and the third magnetic domain Dc, and the magnetic domain walls DW may be disposed between the first magnetic domain Da and the second magnetic domain Db and between the second magnetic domain Db and the third magnetic domain Dc, respectively.

The pinned layer PL may be provided on the top surface of the first magnetic layer FL. In some example embodiments, the pinned layer PL may be disposed on the second magnetic domain Db. For example, the pinned layer PL may vertically overlap with the second magnetic domain Db. The pinned layer PL may include a ferromagnetic material. The pinned layer PL may or may not further include an anti-ferromagnetic material for fixing a magnetization direction of the ferromagnetic material. For example, the pinned layer PL may include at least one metal material of cobalt (Co), iron (Fe), or nickel (Ni). Alternatively or additionally, the pinned layer PL may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). The pinned layer PL having a single-layered structure is illustrated as an example. However, some example embodiments of inventive concepts are not limited thereto. In some example embodiments, the pinned layer PL may have a synthetic anti-ferromagnetic (SAF) structure.

The tunnel barrier pattern TL may be disposed between the first magnetic layer FL and the pinned layer PL. The tunnel barrier pattern TL may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. The pinned layer PL and the tunnel barrier pattern TL, which may have cylindrical shapes are illustrated as an example in FIG. 1. However, some example embodiments of inventive concepts are not limited thereto. For example, a shape of the pinned layer PL and/or of the tunnel barrier pattern TL may not be cylindrical, and be, for example, conical and/or may have a frustum shape and/or may have a rectangular prism shape.

The second magnetic layer ML may be provided on a bottom surface of the first magnetic layer FL. The second magnetic layer ML may be vertically spaced apart from the first magnetic layer FL with the insulating layer DL interposed therebetween. For example, the second magnetic layer ML may be spaced apart from the first magnetic layer FL in a direction opposite to a third direction D3 perpendicular to the top surface of the first magnetic layer FL. A portion of the second magnetic layer ML may vertically overlap with the second magnetic domain Db and the pinned layer PL. For example, the second magnetic layer ML may overlap with the second magnetic domain Db and the pinned layer PL when viewed in a plan view. The second magnetic layer ML may include or consist of at least one metal material of cobalt (Co), iron (Fe), or nickel (Ni).

A length L1 of the second magnetic layer ML in the first direction D1 may be less than or equal to a length L2 of the first magnetic layer FL in the first direction D1. A width W1 of the second magnetic layer ML in a second direction D2 may be substantially equal to a width W2 of the first magnetic layer FL in the second direction D2. The second direction D2 may be parallel to the top surface of the first magnetic layer FL and may be perpendicular to the first direction D1. A thickness T1 of the second magnetic layer ML in the third direction D3 may be substantially equal or similar to the width W1 of the second magnetic layer ML in the second direction D2. For example, there may be a square face of the second magnetic layer ML. The length L1 of the second magnetic layer ML in the first direction D1 may be greater than the thickness T1 of the second magnetic layer ML in the third direction D3 and the width W1 of the second magnetic layer ML in the second direction D2.

The insulating layer DL may be provided on the bottom surface of the first magnetic layer FL. The insulating layer DL may be disposed between the first magnetic layer FL and the second magnetic layer ML. The insulating layer DL may be formed to cover the bottom surface of the first magnetic layer FL, and thus the first magnetic layer FL may not be electrically connected to the second magnetic layer ML. For example, the first magnetic layer FL may be electrically insulated from/isolated from the second magnetic layer ML. The insulating layer DL may include an insulating material, for example, at least one of silicon oxide, silicon nitride, and/or silicon oxynitride.

Figure 2A:
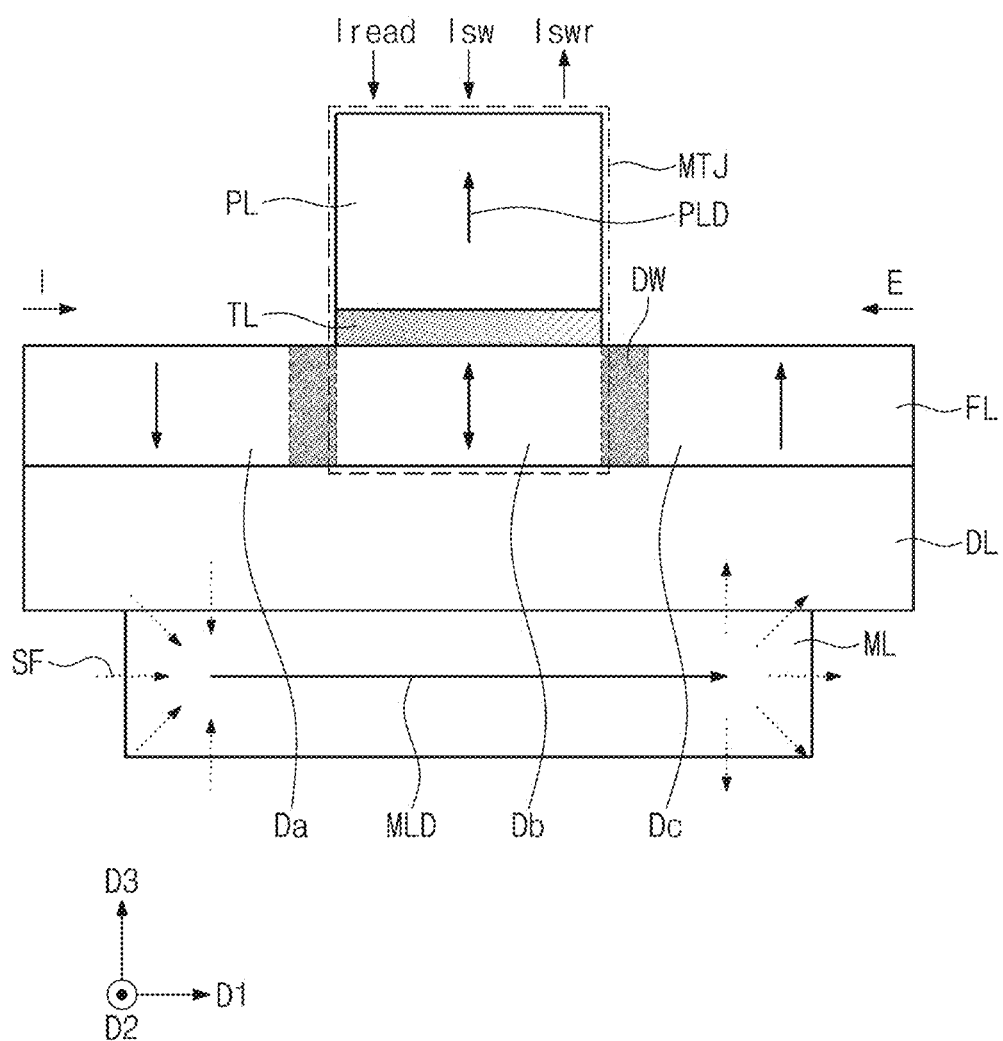
FIGS. 2A, 2B and 2C are cross-sectional views for explaining a magnetic memory device according to some example embodiments of inventive concepts.

FIG. 2A is a cross-sectional view illustrating a magnetic memory device according to some example embodiments of inventive concepts.

Referring to FIG. 2A, the pinned layer PL may be or include a reference layer having a magnetization direction fixed in one direction. The first magnetic layer FL may be or include a free layer having a changeable magnetization direction, e.g. a magnetization direction that may change with respect to the magnetic direction of the pinned layer PL or to the second magnetic layer ML. The second magnetic domain Db may have a magnetization direction changeable to be parallel to or anti-parallel to a magnetization direction PLD of the pinned layer PL. The second magnetic layer ML may be a reference layer having a magnetization direction fixed in a direction perpendicular to the one direction.

In some example embodiments, the magnetization direction PLD of the pinned layer PL and a magnetization direction of each of the first, second and third magnetic domains Da, Db and Dc may be substantially perpendicular to an interface between the pinned layer PL and the tunnel barrier pattern TL (e.g., be substantially parallel to the third direction D3). In this case, the pinned layer PL and the first, second and third magnetic domains Da, Db and Dc may have perpendicular magnetic anisotropy (PMA). As used herein, magnetic anisotropy may mean a property that shows preference to a specific direction when spins are aligned by a magnetic field in a ferromagnetic body. The perpendicular magnetic anisotropy (PMA) may mean or correspond to a property that prefers a magnetization direction substantially perpendicular to the widest surface of a ferromagnetic body.

The pinned layer PL and the first magnetic layer FL may include a ferromagnetic metal having the perpendicular magnetic anisotropy (PMA). The pinned layer PL and the first magnetic layer FL may include at least one of a perpendicular magnetic material (e.g., one or more of CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. For example, the CoPt alloy having the HCP lattice structure may include a cobalt-platinum (CoPt) disordered alloy having a platinum content of about 10% to about 45%, or a $Co_3Pt$ ordered alloy. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where 'n' denotes the number of bilayers.

A magnetization direction MLD of the second magnetic layer ML may be substantially parallel to the interface between the pinned layer PL and the tunnel barrier pattern TL (e.g., be substantially parallel to the first direction D1 or the second direction D2). In this case, the second magnetic layer ML may have in-plane magnetic anisotropy (IMA). As used herein, the in-plane magnetic anisotropy (IMA) may mean or correspond to a property that prefers a magnetization direction substantially parallel to the widest surface of a ferromagnetic body. The second magnetic layer ML may include a ferromagnetic material and may or may not further include an anti-ferromagnetic material for fixing a magnetization direction of the ferromagnetic material.

Particularly, the magnetization directions of the first, second and third magnetic domains Da, Db and Dc may be substantially perpendicular to the magnetization direction MLD of the second magnetic layer ML. The magnetization direction of the first magnetic domain Da and the magnetization direction of the third magnetic domain Dc may be fixed in anti-parallel to each other due to a fringe field/stray field SF generated from the second magnetic layer ML toward the first and third magnetic domains Da and Dc. The magnetization direction of the second magnetic domain Db may be changeable or may be configured to change to be parallel or anti-parallel to the third direction D3 as described above, but the magnetization directions of the first and third magnetic domains Da and Dc may be fixed in anti-parallel to each other. For example, the magnetization direction of the second magnetic domain Db may be parallel or anti-parallel to the magnetization direction of each of the first and third magnetic domains Da and Dc.

The second magnetic domain Db is illustrated as a single magnetic domain in FIGS. 1 and 2A. However, some example embodiments of inventive concepts are not limited thereto. In some example embodiments, the second magnetic domain Db may be provided in plurality. The second magnetic domains Db adjacent to each other may have magnetization directions anti-parallel to each other.

Hereinafter, read and write operations of the magnetic memory device according to the some example embodiments of inventive concepts will be described with reference to FIGS. 2A, 2B and 2C.

Referring again to FIG. 2A, a current I for moving the magnetic domain walls DW may flow through the first magnetic layer FL. A movement direction of the magnetic domain walls DW may be determined by a direction of the current I. The magnetic domain walls DW may be moved in a movement direction of electrons E, and thus the magnetic domain walls DW may be moved in a direction opposite to the direction of the current I. For example, the current I may flow in the first direction D1, and the magnetic domain walls DW may be moved in a direction opposite to the first direction D1. Hereinafter, a magnetic domain that is aligned on the bottom surface of the pinned layer PL of the magnetic domains moved by the movement of the magnetic domain walls DW will be referred to as the second magnetic domain Db. The second magnetic domain Db and the pinned layer PL may constitute be included in/correspond to a magnetic tunnel junction MTJ.

Figure 2B:
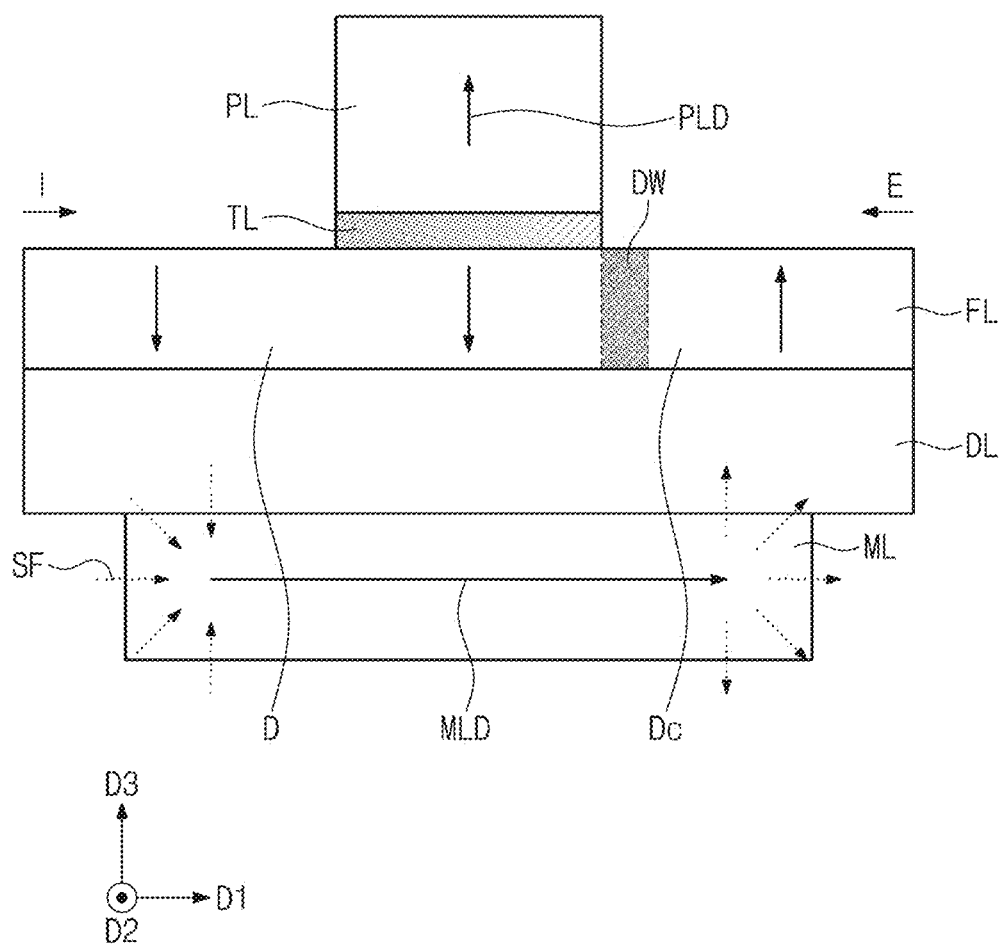

Referring to FIG. 2B, a magnetic domain wall DW between magnetic domains adjacent to each other and having opposite magnetization directions may be moved to a position adjacent to the pinned layer PL by the current I flowing in the first direction D1. The magnetic domain wall DW may have a constant width in the first direction D1 to minimize or reduce a sum of exchange interaction energy and anisotropy energy in a magnetic body. The magnetic domain wall DW may be disposed between a magnetic domain D and a third magnetic domain Dc which have magnetization directions opposite to/anti-parallel to each other. For example, the magnetic domain wall DW which has a constant width in the first direction D1 and a magnetization direction of which is not discontinuously reversed may be disposed at a boundary between the magnetic domain D and the third magnetic domain Dc. Even though not shown in the drawings, magnetization directions in the magnetic domain wall DW may be gradually rotated.

A magnetization direction of the magnetic domain D and a magnetization direction of the third magnetic domain Dc may be fixed in anti-parallel to each other by the stray field SF generated from the second magnetic layer ML.

Figure 2C:
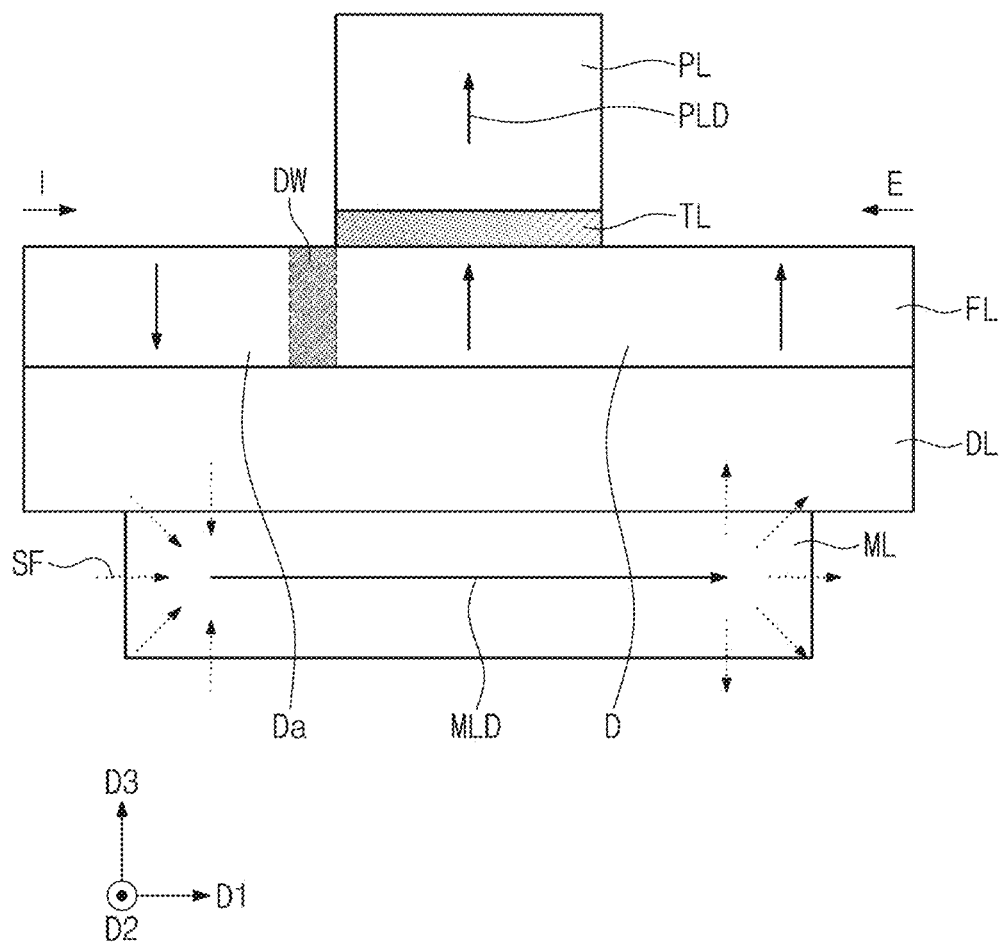

Referring now to FIG. 2C, the magnetic domain wall DW may be moved in the direction opposite to the first direction D1 by the current I flowing in the first direction D1. A first magnetic domain Da and a magnetic domain D which have magnetization directions opposite to/anti-parallel to each other may be formed due to the movement of the magnetic domain wall DW. For example, a magnetization direction of a magnetic domain aligned on the bottom surface of the pinned layer PL may be switched in reverse by the movement of the magnetic domain wall DW.

Even though the magnetic domain wall DW is moved, the magnetization direction of the first magnetic domain Da and the magnetization direction of the magnetic domain D may be fixed in anti-parallel to each other by the stray field SF generated from the second magnetic layer ML.

The magnetic domain wall DW may be moved at a speed of, for example, 50 m/s, and a speed of a write operation may be very fast (such as several nanoseconds (ns), for example, 1 ns). For example, the magnetic domain wall DW may be very quickly moved, and the magnetization direction of the second magnetic domain Db may be very quickly switched.

Thus, visually, the magnetic domain walls DW may be shown to be disposed between the first magnetic domain Da and the second magnetic domain Db and between the second magnetic domain Db and the third magnetic domain Dc, respectively, as illustrated in FIG. 2A. Therefore, hereinafter, the magnetic domains will be described as the first, second and third magnetic domains Da, Db and Dc, and the magnetic domain walls DW disposed between the first and second magnetic domains Da and Db and between the second and third magnetic domains Db and Dc will be described separately.

Referring again to FIG. 2A, in a read operation, a read current Tread may flow through the magnetic tunnel junction MTJ. For example, the read current Iread may flow from the pinned layer PL to the second magnetic domain Db in the direction opposite to/anti-parallel to the third direction D3. A resistance state of the magnetic tunnel junction MTJ may be detected by the read current Tread. Whether the magnetic tunnel junction MTJ is in a high-resistance state or a low-resistance state may be detected by the read current Tread. For example, when the magnetization direction of the second magnetic domain Db is parallel to the magnetization direction PLD of the pinned layer PL, the magnetic tunnel junction MTJ may be in the low-resistance state. For example, when the magnetization direction of the second magnetic domain Db is anti-parallel to the magnetization direction PLD of the pinned layer PL, the magnetic tunnel junction MTJ may be in the high-resistance state. Data, e.g. logical bits, (0 or 1) stored in the second magnetic domain Db may be detected from the resistance state of the magnetic tunnel junction MTJ.

In a write operation, a write current Isw or Iswr may flow through the magnetic tunnel junction MTJ. For example, the write current Isw may flow from the pinned layer PL to the second magnetic domain Db in the direction opposite to the third direction D3. For example, the write current Iswr may flow from the second magnetic domain Db to the pinned layer PL in the third direction D3. A magnitude of the write current Isw or Iswr may be greater than a magnitude of the read current Tread. The magnetization direction of the second magnetic domain Db may be reversed by spin-transfer torque (STT) generated by the write current Isw or Iswr. The magnetization direction of the second magnetic domain Db may be switched to be parallel or anti-parallel to the magnetization direction PLD of the pinned layer PL, by the spin-transfer torque that is generated by the write current Isw or Iswr.

FIGS. 3 to 6 are cross-sectional views illustrating a method of initializing a magnetic memory device according to some example embodiments of inventive concepts. Hereinafter, the descriptions to the same features as mentioned above will be omitted for the purpose of ease and convenience in explanation.

Referring to FIG. 3, the unit cell of the magnetic memory device, which is not initialized or is in an arbitrary state, may be provided in plurality. The magnetization direction MLD of each of the second magnetic layers ML may be randomly arranged and may be parallel or anti-parallel to the interface between the pinned layer PL and the tunnel barrier pattern TL. For example, the magnetization directions MLD of the second magnetic layers ML may be the same as each other or opposite to each other, for example in a random or arbitrary manner. In addition, the magnetization directions of the first magnetic domain Da and the third magnetic domain Dc may be randomly arranged and may be parallel or anti-parallel to a direction perpendicular to the interface between the pinned layer PL and the tunnel barrier pattern TL. For example, the magnetization directions of the first magnetic domain Da and the third magnetic domain Dc may be parallel or anti-parallel to the magnetization direction PLD of the pinned layer PL. In some example embodiments, the first magnetic layer FL may be affected by a minimized/reduced stray field of the second magnetic layer ML. Thus, the magnetization direction of the first magnetic domain Da and the magnetization direction of the third magnetic domain Dc may be opposite to/anti-parallel to each other.

Figure 4:
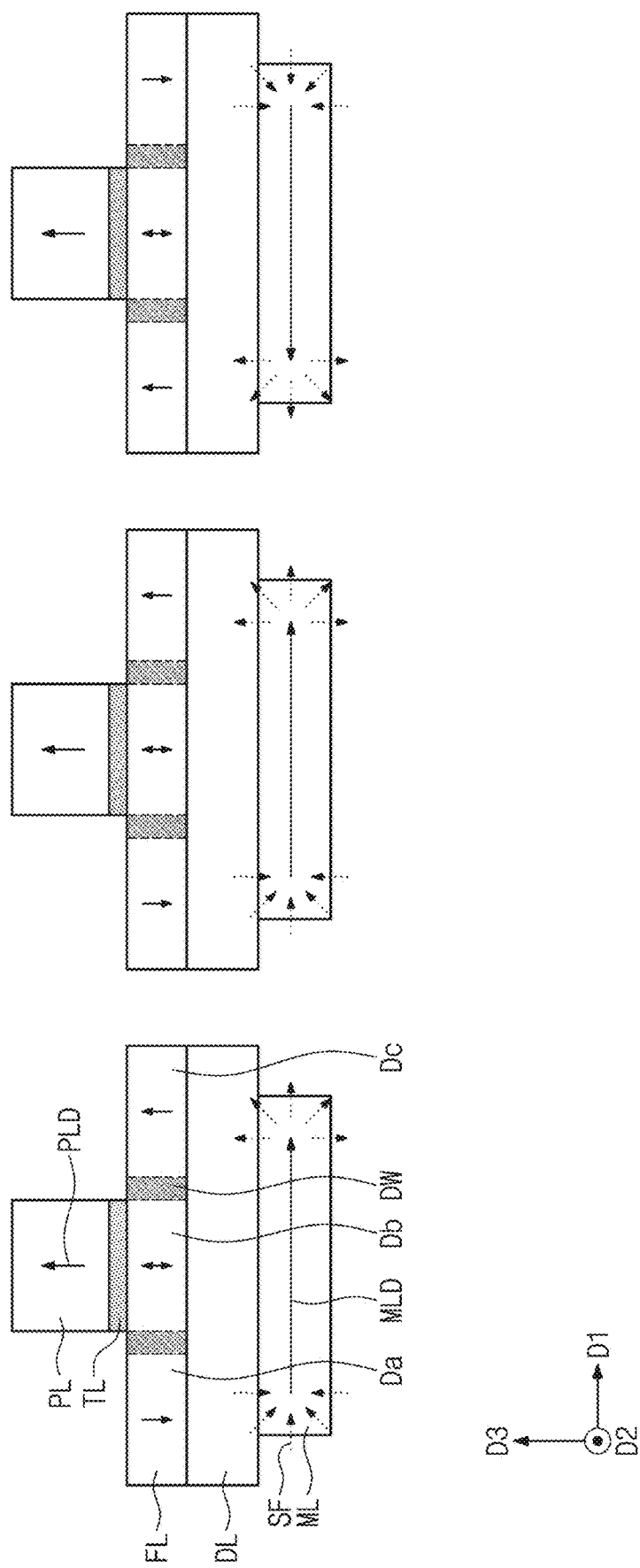

Referring to FIG. 4, a high-temperature treatment process may be performed on the magnetic memory device. Magnitudes of coercive fields of the first and third magnetic domains Da and Dc may be reduced by the high-temperature treatment process. Thus, the first and third magnetic domains Da and Dc may be more effectively affected and/or more amenable to being changed by the stray field SF generated from the second magnetic layer ML. For example, the magnetization directions of the first and third magnetic domains Da and Dc may be switched by the stray field SF generated from the second magnetic layer ML. Thus, the magnetization direction of the first magnetic domain Da and the magnetization direction of the third magnetic domain Dc may be fixed to be anti-parallel to each other by the stray field SF generated from the second magnetic layer ML. For example, when the magnetization direction MLD of the second magnetic layer ML is parallel to the first direction D1, the magnetization direction of the first magnetic domain Da may be anti-parallel to the third direction D3, and the magnetization direction of the third magnetic domain Dc may be parallel to the third direction D3. For example, when the magnetization direction MLD of the second magnetic layer ML is anti-parallel to the first direction D1, the magnetization direction of the first magnetic domain Da may be parallel to the third direction D3, and the magnetization direction of the third magnetic domain Dc may be anti-parallel to the third direction D3.

Figure 5:
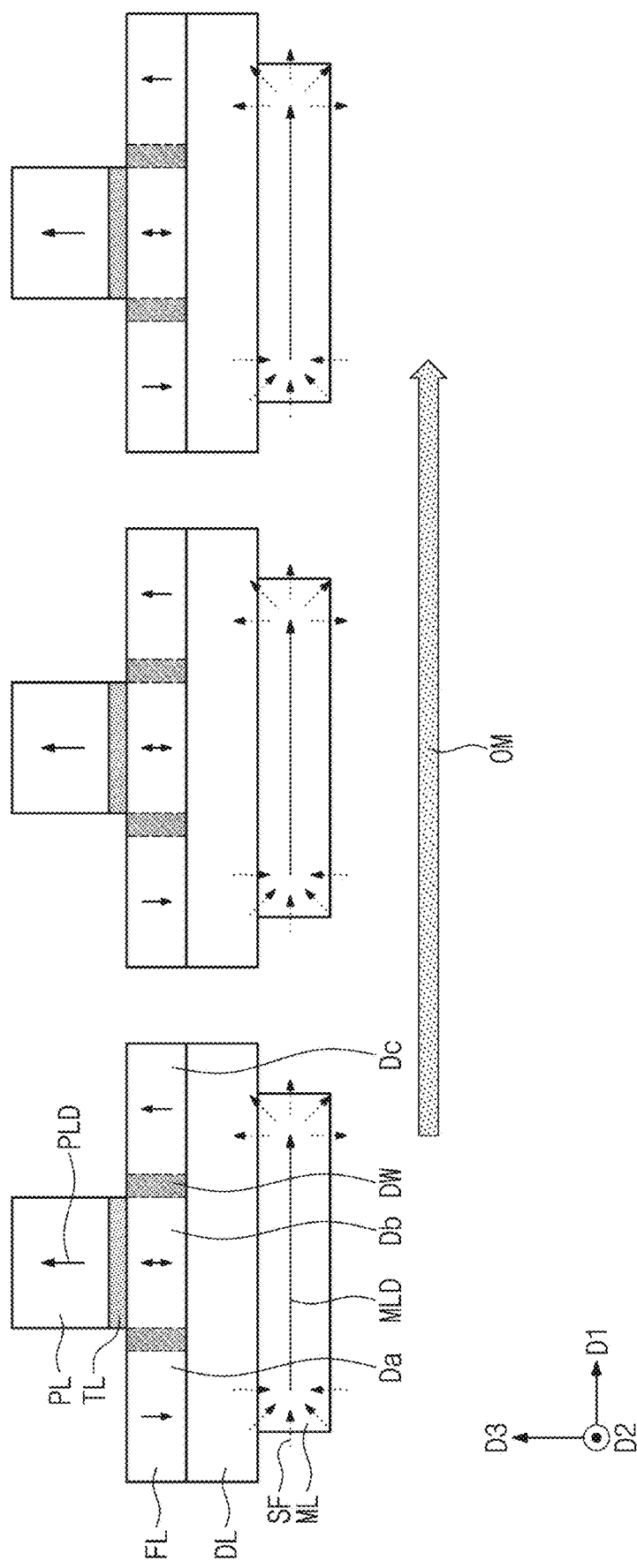

Referring now to FIG. 5, an external magnetic field treatment process may be performed on the magnetic memory device. The magnetization directions MLD of the second magnetic layers ML may be arranged/switched to the same direction as an external magnetic field OM by the external magnetic field treatment process. Thus, the magnetization directions of the first and third magnetic domains Da and Dc may be arranged/switched by the stray field SF generated from the second magnetic layer ML. For example, when the external magnetic field OM is parallel to the first direction D1, the magnetization directions MLD of the second magnetic layers ML may be or be switched to be parallel to the first direction D1. Thus, the magnetization direction of the first magnetic domain Da may be switched to be anti-parallel to the third direction D3, and the magnetization direction of the third magnetic domain Dc may be switched to be parallel to the third direction D3.

Figure 6:
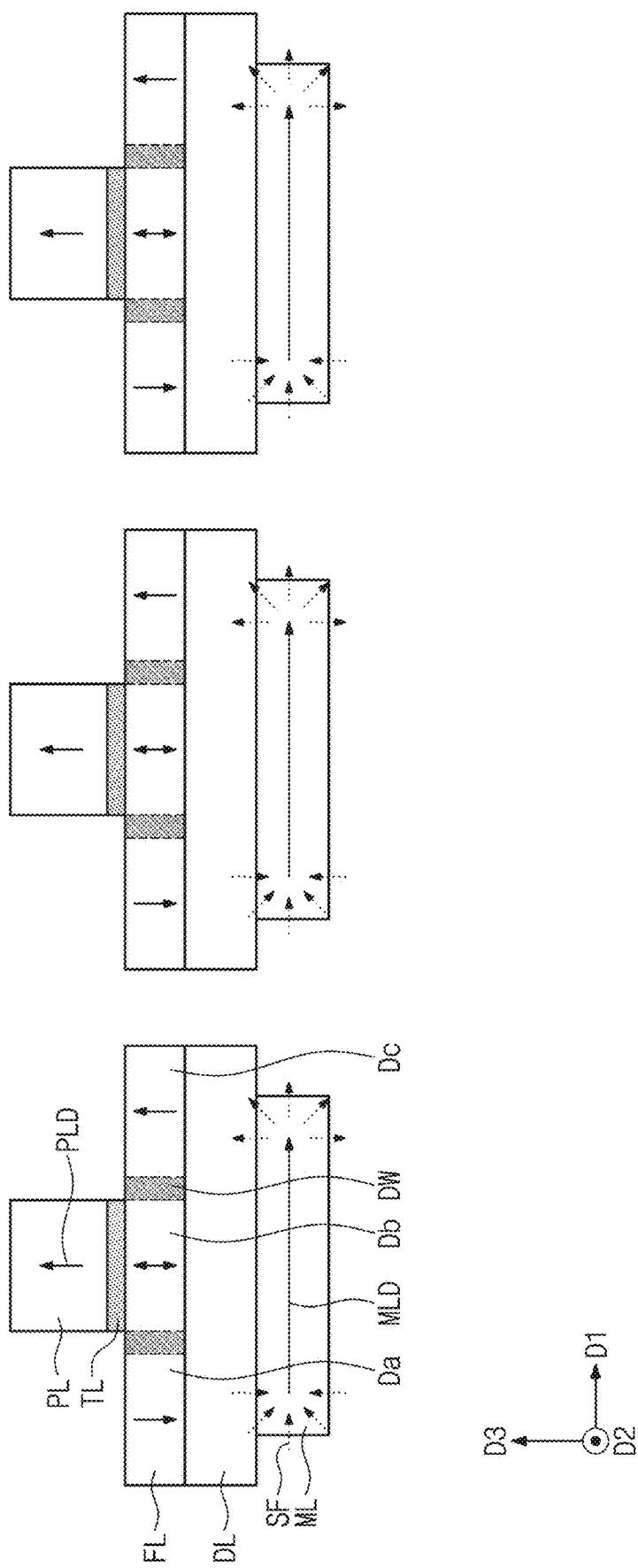

Referring to FIG. 6, a low-temperature treatment process may be performed on the magnetic memory device, and/or a temperature of the magnetic memory device may be lowered to a room temperature without an additional process. Thus, the magnitudes of the coercive fields of the first and third magnetic domains Da and Dc may be increased. As a result, the magnetization directions of the first and third magnetic domains Da and Dc may be relatively less affected by other external factors, and thus magnetic moments of the first and third magnetic domains Da and Dc may be maintained in a strong state. For example, the magnetization directions of the first and third magnetic domains Da and Dc may be fixed in anti-parallel to each other.

Figure 7:
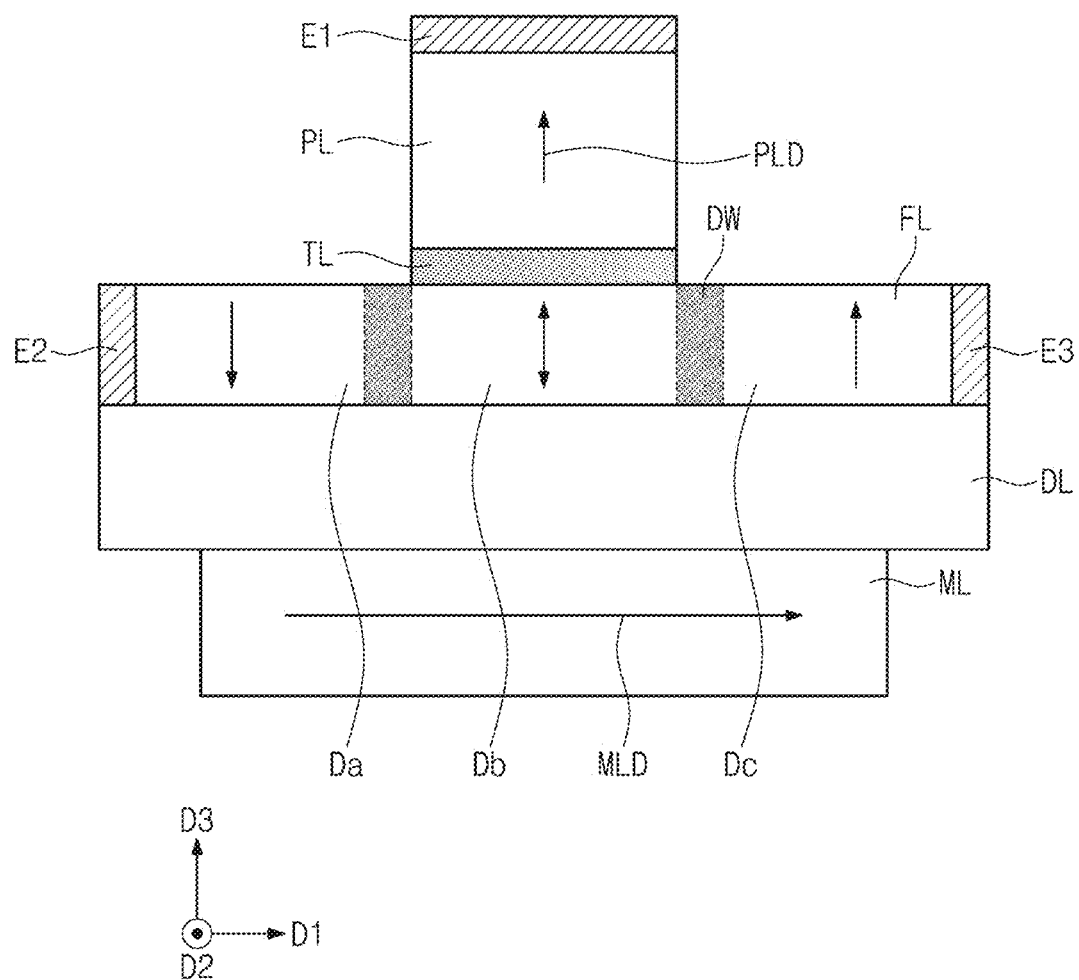
FIG. 7 is a cross-sectional view illustrating a magnetic memory device according to some example embodiments of inventive concepts.

FIG. 7 is a cross-sectional view illustrating a magnetic memory device according to some example embodiments of inventive concepts. Hereinafter, the descriptions to the same components and/or features as in some of the above embodiments will be omitted for the purpose of ease and convenience in explanation.

Referring to FIG. 7, a unit cell of a magnetic memory device according to some example embodiments of inventive concepts may include a pinned layer PL, a first magnetic layer FL, a tunnel barrier pattern TL, an insulating layer DL and a second magnetic layer ML and may further include at least one of a first electrode E1, a second electrode E2 and a third electrode E3.

The first electrode El1 may be provided on the pinned layer PL. The first electrode E1 may be connected to/directly connected to the pinned layer PL. For example, the first electrode E1 may cover a top surface of the pinned layer PL. The second electrode E2 may be provided on one sidewall of the first magnetic layer FL. The second electrode E2 may be connected to/directly connected to the one sidewall of the first magnetic layer FL. For example, the second electrode E2 may cover the one sidewall of the first magnetic layer FL. The third electrode E3 may be provided on another sidewall of the first magnetic layer FL, which is opposite to the one sidewall of the first magnetic layer FL in the first direction D1. The third electrode E3 may be connected to/directly connected to the other sidewall of the first magnetic layer FL. For example, the third electrode E3 may cover the other sidewall of the first magnetic layer FL. The structures of the first, second and third electrodes E1, E2 and E3 in FIG. 7 are illustrated as an example. However, some example embodiments of inventive concepts are not limited thereto.

Even though not shown in the drawings, transistors, such as NMOS transistors and/or PMOS transistors, may be connected to two of the first to third electrodes E1, E2 and E3. For an example, gates and/or sources and/or drains of two transistors may be connected to the first electrode E1 and the second electrode E2. For another example, gates and/or sources and/or drains of two transistors may be connected to the second electrode E2 and the third electrode E3. The transistors may include a drive transistor for moving the magnetic domain wall DW, and/or a transistor for writing or reading magnetization directions into or from the first, second and third magnetic domains Da, Db and Dc.

Figure 8:
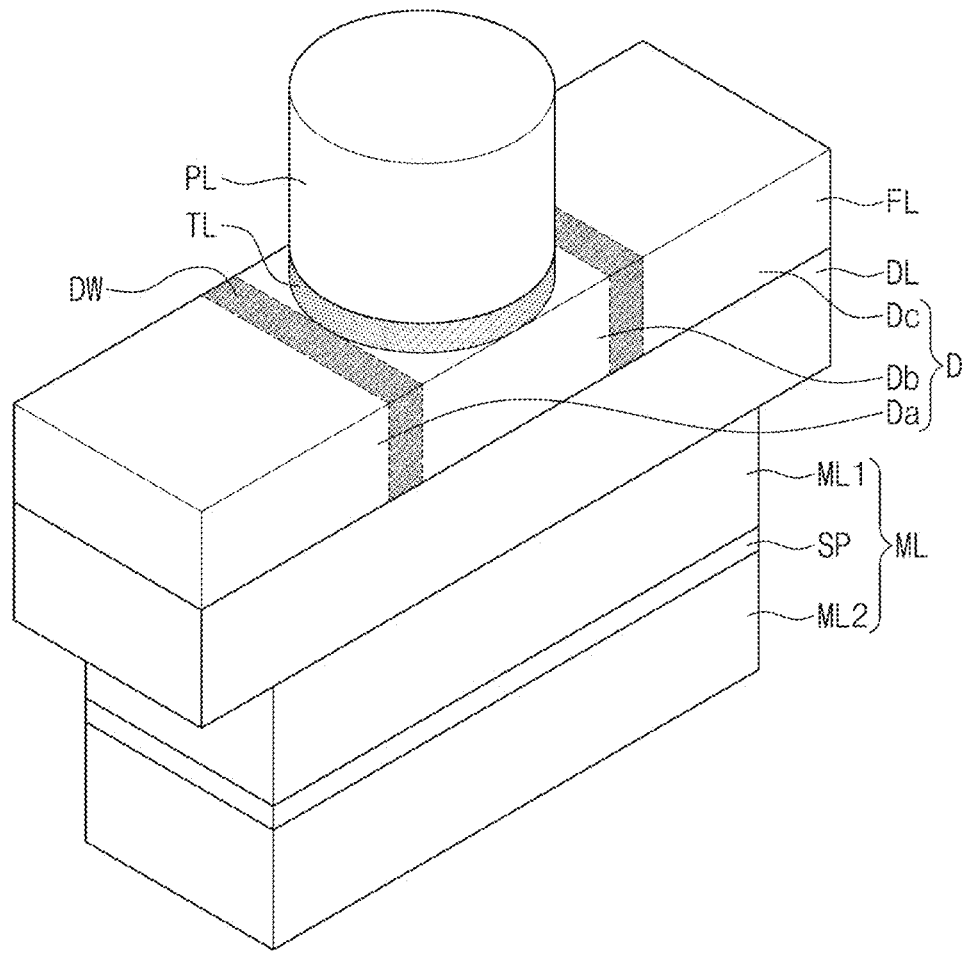
FIG. 8 is a perspective view schematically illustrating a magnetic memory device according to some example embodiments of inventive concepts.

FIG. 8 is a perspective view schematically illustrating a magnetic memory device according to some example embodiments of inventive concepts. FIG. 9 is a cross-sectional view illustrating a magnetic memory device according to some example embodiments of inventive concepts. Hereinafter, the descriptions to the same components and/or features as in the above embodiments will be omitted for the purpose of ease and convenience in explanation.

Referring to FIGS. 8 and 9, a unit cell of a magnetic memory device according to some example embodiments of inventive concepts may include a pinned layer PL, a first magnetic layer FL, a tunnel barrier pattern TL, an insulating layer DL, and a second magnetic layer ML.

The second magnetic layer ML may have a synthetic anti-ferromagnetic (SAF) structure. The synthetic anti-ferromagnetic (SAF) structure may include a first magnetic pattern ML1, a second magnetic pattern ML2, and a spacer pattern SP. The first magnetic pattern ML1 may be disposed on the bottom surface of the insulating layer DL. The spacer pattern SP may be disposed between the first magnetic pattern ML1 and the second magnetic pattern ML2.

A magnetization direction of each of, e.g. either of, the first and second magnetic patterns ML1 and ML2 may be parallel to the first direction D1 or may be anti-parallel to the first direction D1. For example the magnetization directions of the first and second magnetic patterns ML1 and ML2 may be anti-parallel to each other. The first magnetic pattern ML1 and the second magnetic pattern ML2 may have the magnetization directions which are anti-parallel to each other and are fixed. The first magnetic pattern ML1 and the second magnetic pattern ML2 may include a ferromagnetic material. For example, the first magnetic pattern ML1 and the second magnetic pattern ML2 may include at least one metal material of cobalt (Co), iron (Fe), or nickel (Ni). The first magnetic pattern ML1 and the second magnetic pattern ML2 may include or consist of the same material, or may include or consist of different materials. A thickness of the first magnetic pattern ML1 may be the same as, or different from (e.g. thinner than or thicker than), the second magnetic pattern ML2.

For example, the spacer pattern SP may include at least one of ruthenium (Ru), iridium (Jr), rhodium (Rh), or osmium (Os). The first magnetic pattern ML1 and the second magnetic pattern ML2 may have the magnetization directions anti-parallel to each other by Ruderman-Kittel-Kasuya-Yosida (RKKY) interaction of the spacer pattern SP. Magnetic fields generated by the first and second magnetic patterns ML1 and ML2 may cancel each other by the spacer pattern SP. Thus, a magnitude of a stray field of the second magnetic layer ML may be minimized or reduced.

Since the second magnetic layer ML is provided as the synthetic anti-ferromagnetic (SAF) structure, the magnitude of the stray field generated from the second magnetic layer ML toward the first magnetic layer FL may be reduced. For example, the influence of the stray field on the first magnetic layer FL may be minimized or reduced, and thus the magnetization direction of the first magnetic domain Da and the magnetization direction of the third magnetic domain Dc may be maintained in anti-parallel to each other and in a fixed state.

FIGS. 10 to 13 are cross-sectional views illustrating a method of initializing a magnetic memory device according to some example embodiments of inventive concepts. Hereinafter, the descriptions to the same features as mentioned above will be omitted for the purpose of ease and convenience in explanation.

Figure 10:
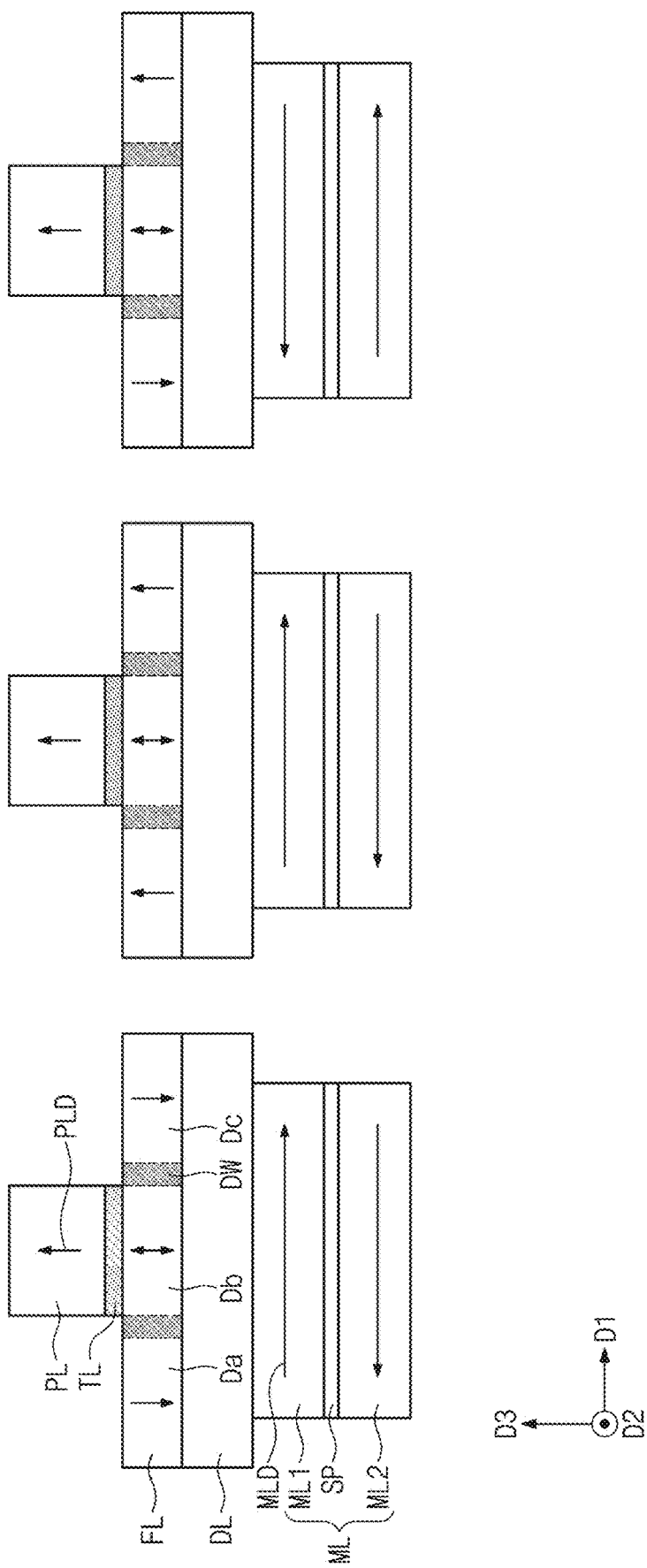
FIGS. 10 to 13 are cross-sectional views illustrating a method of initializing a magnetic memory device according to some example embodiments of inventive concepts.

Referring to FIG. 10, the unit cell of the magnetic memory device, which is not initialized or is in an arbitrary state, may be provided in plurality. The second magnetic layer ML may have the synthetic anti-ferromagnetic (SAF) structure. The synthetic anti-ferromagnetic (SAF) structure may include the first magnetic pattern ML1, the second magnetic pattern ML2, and the spacer pattern SP disposed between the first magnetic pattern ML1 and the second magnetic pattern ML2.

The magnetization direction MLD of each of the first magnetic patterns ML1 may be randomly arranged and may be parallel or anti-parallel to the interface between the pinned layer PL and the tunnel barrier pattern TL. For example, the magnetization directions MLD of the first magnetic patterns ML1 may be the same as each other or opposite to each other. The second magnetic pattern ML2 may have the magnetization direction anti-parallel to the magnetization direction MLD of the first magnetic pattern ML1. In addition, the magnetization directions of the first magnetic domain Da and the third magnetic domain Dc may be randomly arranged/arbitrarily arranged, and may be parallel or anti-parallel to a direction perpendicular to the interface between the pinned layer PL and the tunnel barrier pattern TL. For example, the magnetization directions of the first magnetic domain Da and the third magnetic domain Dc may be parallel or anti-parallel to the magnetization direction PLD of the pinned layer PL. In some example embodiments, the magnetic fields generated by the first and second magnetic patterns ML1 and ML2 may cancel each other, and thus the influence of the stray field generated from the second magnetic layer ML toward the first magnetic layer FL may be minimized. Thus, the magnetization direction of the first magnetic domain Da and the magnetization direction of the third magnetic domain Dc may be the same as each other or opposite to each other.

Figure 11:
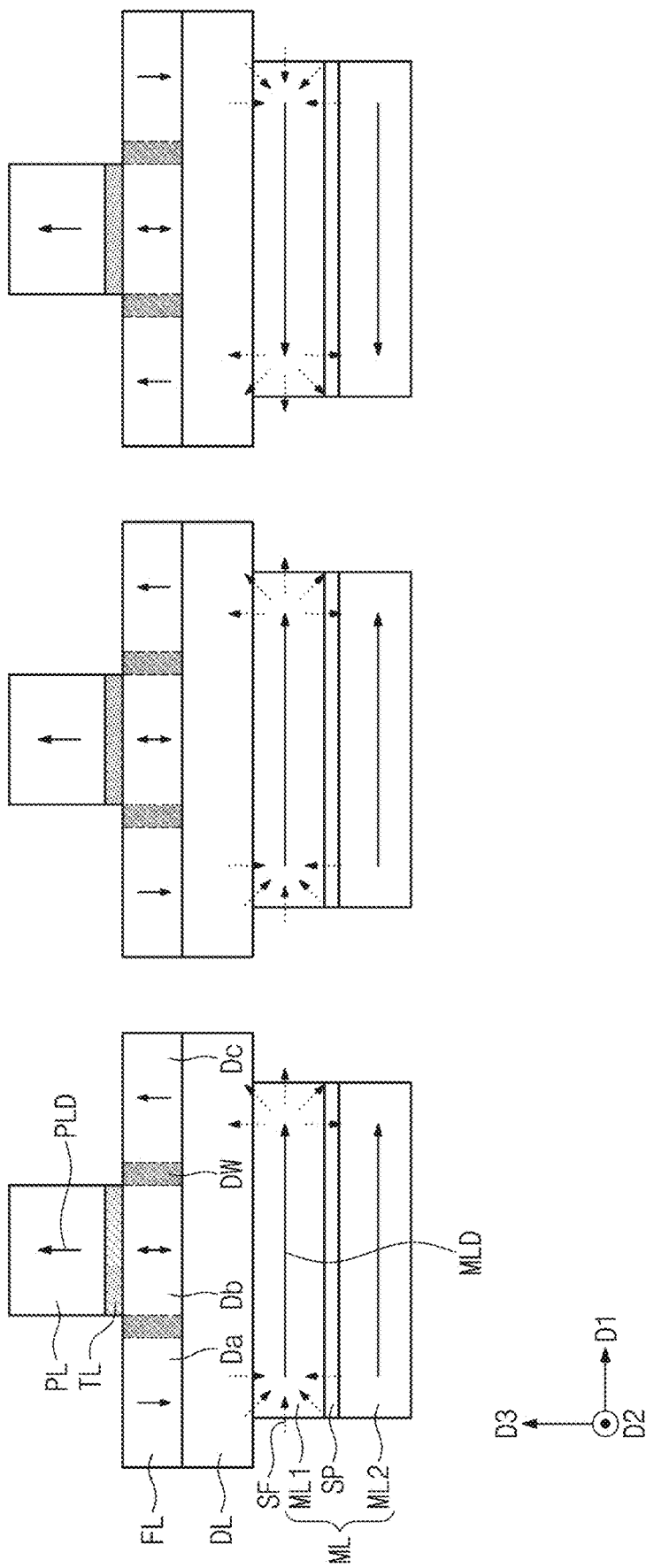

Referring to FIG. 11, a high-temperature treatment process may be performed on the magnetic memory device. Magnitudes of coercive fields of the first and third magnetic domains Da and Dc may be reduced by the high-temperature treatment process. At the same time, a synthetic anti-ferromagnetic (SAF) property of the second magnetic layer ML may be lost by the high-temperature treatment process. Thus, the magnetization direction of the second magnetic pattern ML2 may be switched to be parallel to the magnetization direction MLD of the first magnetic pattern ML1. Alternatively, the magnetization direction MLD of the first magnetic pattern ML1 may be switched to be parallel to the magnetization direction of the second magnetic pattern ML2. For example, the magnetic fields generated by the first and second magnetic patterns ML1 and ML2 may not cancel each other, and thus the magnitude of the stray field SF of the second magnetic layer ML may be maximized or increased.

Thus, the first and third magnetic domains Da and Dc may be more effectively affected by the stray field SF generated from the second magnetic layer ML (particularly, the first magnetic pattern ML1). For example, the magnetization directions of the first and third magnetic domains Da and Dc may be switched by the stray field SF generated from the second magnetic layer ML (particularly, the first magnetic pattern ML1). The magnetization direction of the first magnetic domain Da and the magnetization direction of the third magnetic domain Dc may be fixed in anti-parallel to each other by the stray field SF. For example, when the magnetization direction MLD of the first magnetic pattern ML1 is parallel to the first direction D1, the magnetization direction of the first magnetic domain Da may be anti-parallel to the third direction D3, and the magnetization direction of the third magnetic domain Dc may be parallel to the third direction D3. For example, when the magnetization direction MLD of the first magnetic pattern ML1 is anti-parallel to the first direction D1, the magnetization direction of the first magnetic domain Da may be parallel to the third direction D3, and the magnetization direction of the third magnetic domain Dc may be anti-parallel to the third direction D3.

Figure 12:
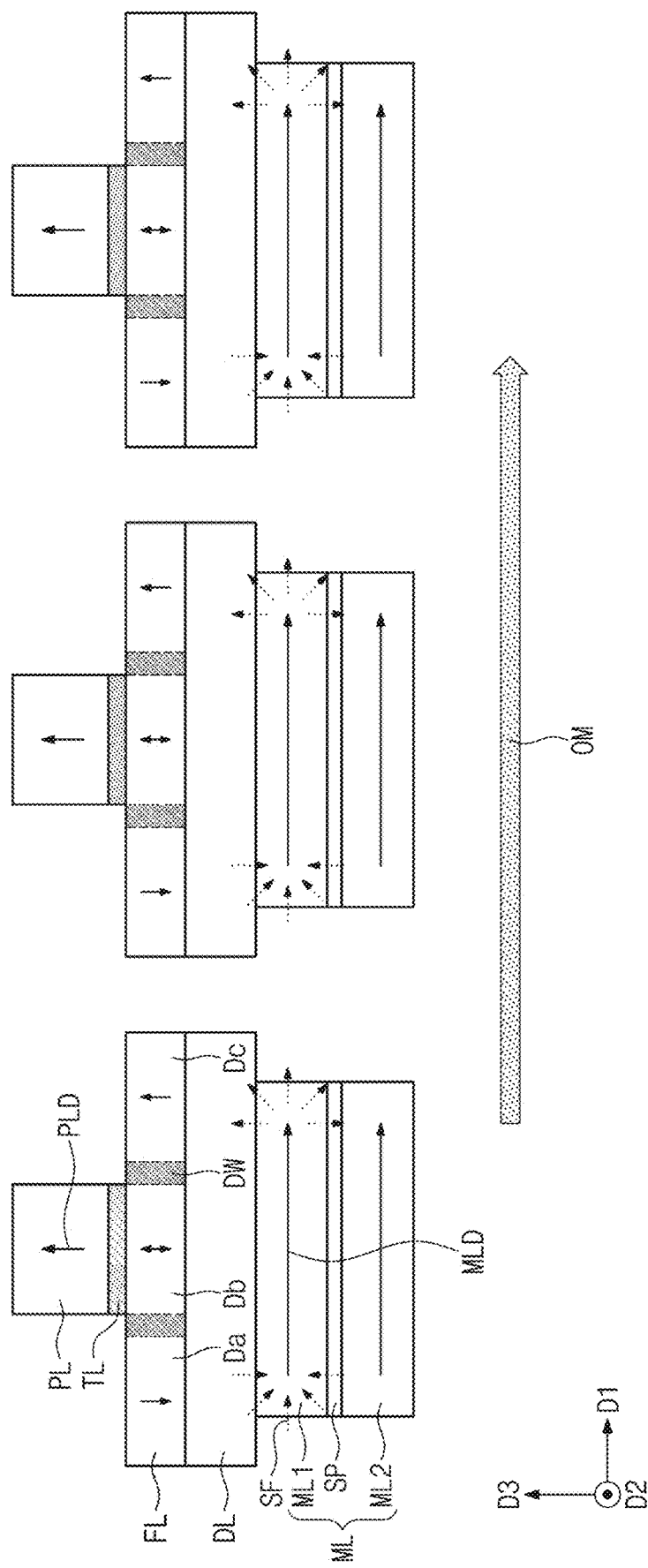

Referring to FIG. 12, an external magnetic field treatment process may be performed on the magnetic memory device. The magnetization direction MLD of the first magnetic pattern ML1 and the magnetization direction of the second magnetic pattern ML2 may be switched to the same direction as the external magnetic field OM by the external magnetic field treatment process. Thus, the magnetization directions of the first and third magnetic domains Da and Dc may be switched by the stray field SF generated from the second magnetic layer ML (particularly, the first magnetic pattern ML1). For example, when the external magnetic field OM is parallel to the first direction D1, the magnetization direction MLD of the first magnetic pattern ML1 and the magnetization direction of the second magnetic pattern ML2 may be switched to be parallel to the first direction D1. Thus, the magnetization direction of the first magnetic domain Da may be switched to be anti-parallel to the third direction D3, and the magnetization direction of the third magnetic domain Dc may be switched to be parallel to the third direction D3.

Figure 13:
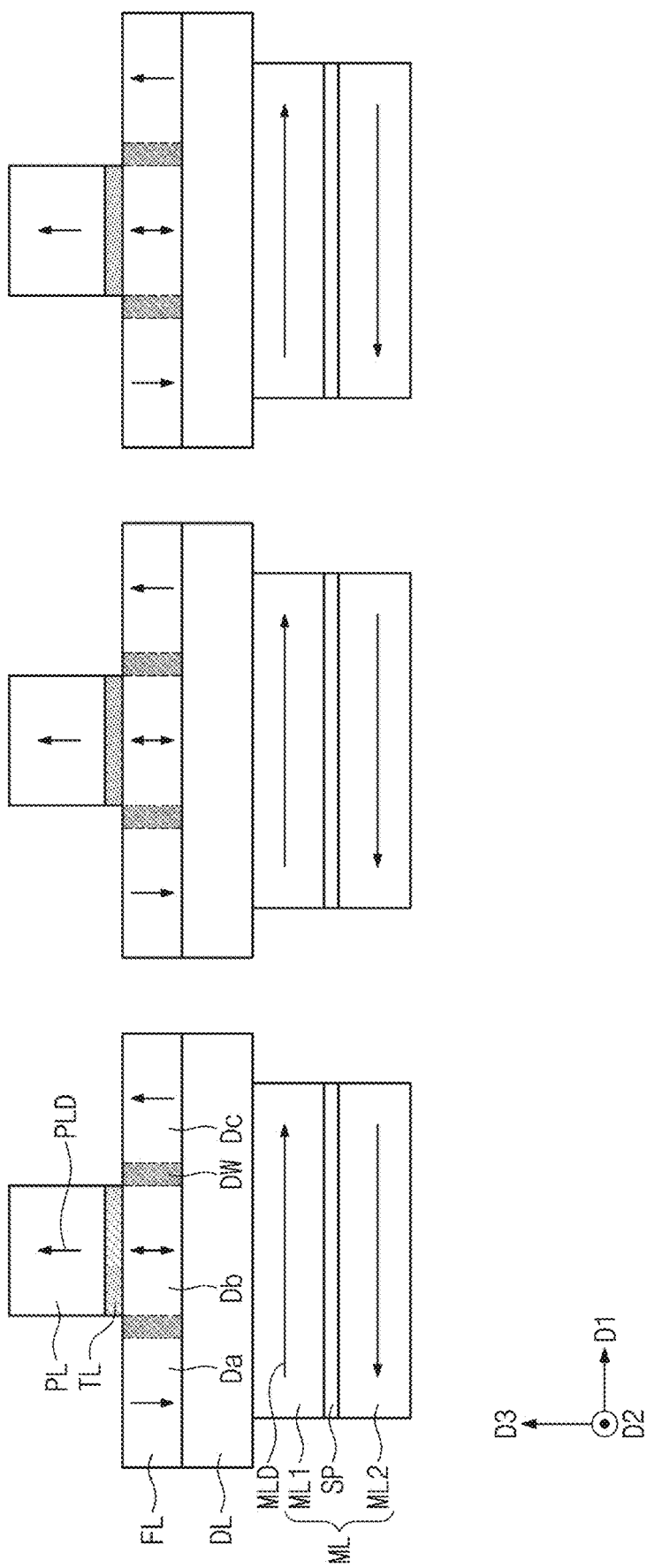

Referring to FIG. 13, a low-temperature treatment process may be performed on the magnetic memory device, or a temperature of the magnetic memory device may be lowered to a room temperature without an additional process. Thus, the magnitudes of the coercive fields of the first and third magnetic domains Da and Dc may be increased. As a result, the magnetization directions of the first and third magnetic domains Da and Dc may be relatively less affected by other external factors, and thus magnetic moments of the first and third magnetic domains Da and Dc may be maintained in a strong state. In other words, the magnetization directions of the first and third magnetic domains Da and Dc may be fixed in anti-parallel to each other.

According to the some example embodiments of inventive concepts, magnetization directions of magnetic domains adjacent to both sidewalls of a free layer may be fixed to be opposite to each other by a simple initialization process, and thus reliability of the magnetic memory device may be improved. As a result, read and write operations may be more accurately performed. Alternatively or additionally, speeds of the write and read operations may be very fast by using the movement principle of the magnetic domain wall, and thus an operating speed of the magnetic memory device may be improved.

Example embodiments are not limited to those described above. Furthermore, unless clear from context, example embodiments described with reference to some features are mutually exclusive to one another. For example, example embodiments may include some features described with reference to one figure, and some other features described with reference to another feature.

While some inventive concepts have been described with reference to example embodiments, it will be apparent to those of ordinary skill in the art that various changes and modifications may be made without departing from the spirits and scopes of the inventive concepts. Therefore, it should be understood that example embodiments are not limiting, but illustrative. Thus, the scopes of inventive concepts are to be determined by the broadest permissible interpretation of the following claims and their equivalents, and shall not be restricted and/or limited by the foregoing description.

What is claimed is:

1. A magnetic memory device comprising:
   a first magnetic layer extending in a first direction;
   a pinned layer on the first magnetic layer; and
   a second magnetic layer vertically overlapping with the pinned layer with the first magnetic layer interposed between the pinned layer and the second magnetic layer,
   wherein the first magnetic layer includes, a plurality of magnetic domains arranged in the first direction, and at least one magnetic domain wall between the plurality of magnetic domains,
   a magnetization direction of the second magnetic layer is substantially parallel to a top surface of the first magnetic layer, and
   one or more electrodes are on a sidewall of the first magnetic layer.

2. The magnetic memory device of claim 1, wherein the plurality of magnetic domains includes a first magnetic domain, a second magnetic domain, and a third magnetic domain, the first through third magnetic domains sequentially arranged in the first direction, and a magnetization direction of the first magnetic domain and a magnetization direction of the third magnetic domain are anti-parallel to each other.

3. The magnetic memory device of claim 2, wherein the second magnetic domain is configured to have a magnetization direction changeable to be parallel to a magnetization direction of the pinned layer or to be anti-parallel to the magnetization direction of the pinned layer.

4. The magnetic memory device of claim 1, wherein the plurality of magnetic domains has a perpendicular magnetic anisotropy such that a magnetization direction of the plurality of the magnetic domains is perpendicular to a widest surface of the plurality of the magnetic domains.

5. The magnetic memory device of claim 1, wherein the pinned layer has a perpendicular magnetic anisotropy such that a magnetization direction of the pinned layer is perpendicular to a widest surface of the pinned layer.

6. The magnetic memory device of claim 1, further comprising:
a tunnel barrier pattern between the first magnetic layer and the pinned layer.

7. The magnetic memory device of claim 1, further comprising:
an insulating layer between the first magnetic layer and the second magnetic layer.

8. The magnetic memory device of claim 1, wherein the second magnetic layer has a synthetic anti-ferromagnetic (SAF) structure.

9. The magnetic memory device of claim 8, wherein the synthetic anti-ferromagnetic (SAF) structure comprises:
a first magnetic pattern;
a second magnetic pattern; and
a spacer pattern between the first magnetic pattern and the second magnetic pattern.

10. The magnetic memory device of claim 9, wherein a magnetization direction of the first magnetic pattern and a magnetization direction of the second magnetic pattern are anti-parallel to each other.

11. The magnetic memory device of claim 1, wherein a length of the second magnetic layer in the first direction is less than or equal to a length of the first magnetic layer in the first direction.

12. The magnetic memory device of claim 1, wherein a width of the second magnetic layer in a second direction, is substantially equal to a width of the first magnetic layer in the second direction, the second direction parallel to the top surface of the first magnetic layer and perpendicular to the first direction.

13. The magnetic memory device of claim 1, wherein a thickness of the second magnetic layer in a third direction is substantially equal to a width of the second magnetic layer in a second direction, the third direction perpendicular to the top surface of the first magnetic layer and the second direction parallel to the top surface of the first magnetic layer and perpendicular to the first direction.

14. A magnetic memory device comprising:
a first magnetic layer extending in a first direction;
a pinned layer on the first magnetic layer; and
a second magnetic layer vertically overlapping with the pinned layer with the first magnetic layer interposed between the pinned layer and the second magnetic layer, wherein the first magnetic layer includes a plurality of magnetic domains arranged in the first direction and at least one magnetic domain wall between the plurality of magnetic domains, and a magnetization direction of the second magnetic layer is substantially perpendicular to magnetization directions of the magnetic domains, and one or more electrodes are on a sidewall of the first magnetic layer.

15. The magnetic memory device of claim 14, wherein the second magnetic layer has a synthetic anti-ferromagnetic (SAF) structure, and the synthetic anti-ferromagnetic (SAF) structure comprises a first magnetic pattern, a second magnetic pattern, and a spacer pattern disposed between the first magnetic pattern and the second magnetic pattern.

16. The magnetic memory device of claim 14, wherein the plurality of magnetic domains includes a first magnetic domain, a second magnetic domain, and a third magnetic domain, the first through third magnetic domains sequentially arranged in the first direction, and a magnetization direction of the first magnetic domain and a magnetization direction of the third magnetic domain are anti-parallel to each other.

17. The magnetic memory device of claim 14, further comprising:
a first electrode on the pinned layer;
a second electrode on one sidewall of the first magnetic layer; and
a third electrode on another sidewall of the first magnetic layer, the other sidewall opposite to the one sidewall of the first magnetic layer in the first direction.

18. A magnetic memory device comprising:
a first magnetic layer extending in a first direction;
a pinned layer on the first magnetic layer;
a tunnel barrier pattern between the first magnetic layer and the pinned layer;
a second magnetic layer vertically overlapping with the pinned layer with the first magnetic layer interposed between the pinned layer and the second magnetic layer; and
an insulating layer between the first magnetic layer and the second magnetic layer, wherein the first magnetic layer includes a first magnetic domain, a second magnetic domain, and a third magnetic domain, the first through third magnetic domains sequentially arranged in the first direction, a magnetization direction of the second magnetic layer is substantially parallel to a top surface of the first magnetic layer, and a magnetization direction of the first magnetic domain and a magnetization direction of the third magnetic domain are anti-parallel to each other.

19. The magnetic memory device of claim 18, wherein the insulating layer includes at least one of silicon oxide or silicon nitride.

20. The magnetic memory device of claim 18, wherein the second magnetic domain includes a plurality of second magnetic domains, and each of the second magnetic domains has a magnetization direction changeable to be parallel to a magnetization direction of the pinned layer or to be anti-parallel to the magnetization direction of the pinned layer.

* * * * *